US012356552B2

(12) United States Patent
Park

(10) Patent No.: US 12,356,552 B2
(45) Date of Patent: Jul. 8, 2025

(54) CAPACITOR FORMED WITH COUPLED DIES

(71) Applicant: Intel Corporation, Santa Clara, CA (US)

(72) Inventor: Changyok Park, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 790 days.

(21) Appl. No.: 17/359,431

(22) Filed: Jun. 25, 2021

(65) Prior Publication Data

US 2022/0415572 A1 Dec. 29, 2022

(51) Int. Cl.
H05K 1/18 (2006.01)

(52) U.S. Cl.
CPC .................................. *H05K 1/183* (2013.01)

(58) Field of Classification Search
None
See application file for complete search history.

(56) References Cited

U.S. PATENT DOCUMENTS

| | | | | |
|---|---|---|---|---|
| 3,104,377 | A | * | 9/1963 | Alexander ............... H01G 7/02 310/357 |
| 3,833,838 | A | * | 9/1974 | Christiansen ............ H05K 1/16 174/253 |
| 3,881,244 | A | * | 5/1975 | Kendall .................. H01L 27/08 336/200 |
| 4,780,795 | A | * | 10/1988 | Meinel ................. H01F 17/062 257/E25.031 |
| 5,444,600 | A | * | 8/1995 | Dobkin ................. H01L 23/642 29/25.42 |
| 5,811,880 | A | * | 9/1998 | Banerjee ................. H01L 24/49 257/924 |
| 5,939,766 | A | * | 8/1999 | Stolmeijer .......... H01L 23/5223 257/307 |

(Continued)

FOREIGN PATENT DOCUMENTS

| | | | | |
|---|---|---|---|---|
| CN | 107683529 | A | * 2/2018 | ....... H01L 21/02233 |
| CN | 113851477 | A | * 12/2021 | ....... H01L 27/10808 |
| KR | 100470116 | B1 | * 2/2005 | |

OTHER PUBLICATIONS

Extended European Search Report for European Patent Application No. 22171303.5 mailed Nov. 18, 2022, 8 pgs.

(Continued)

*Primary Examiner* — Binh B Tran
*Assistant Examiner* — Muhammed Azam
(74) *Attorney, Agent, or Firm* — Schwabe, Williamson & Wyatt P.C.

(57) ABSTRACT

A capacitor includes a first die with a first side and a second side, wherein the first side of the first die includes a trace pattern. The capacitor also includes and a second die with a first side and a second side, wherein the first side of the second die includes the trace pattern. The first side of the first die and the first side of the second die are coupled to form a trace pattern of the capacitor, wherein the trace pattern of the capacitor comprises an interdigitated pattern, a first pad, and a second pad at an interface of the first side of the first die and the first side of the second die, the first pad at a first side of the interdigitated pattern, and the second pad at a second side of the interdigitated pattern, the second side laterally opposite the first side.

19 Claims, 14 Drawing Sheets

(56) References Cited

U.S. PATENT DOCUMENTS

| | | | | |
|---|---|---|---|---|
| 6,083,785 | A * | 7/2000 | Segawa | H01L 28/40 257/E27.105 |
| 6,385,033 | B1 * | 5/2002 | Javanifard | H01L 23/5223 257/532 |
| 6,410,955 | B1 * | 6/2002 | Baker | H01L 28/82 257/908 |
| 6,446,317 | B1 * | 9/2002 | Figueroa | H01L 23/642 29/25.42 |
| 6,492,707 | B1 * | 12/2002 | Kaku | H01L 23/5223 257/277 |
| 6,532,143 | B2 * | 3/2003 | Figueroa | H01G 4/30 361/306.3 |
| 6,881,895 | B1 * | 4/2005 | Barratt | H03H 7/09 333/204 |
| 6,897,511 | B2 * | 5/2005 | Marotta | H01L 23/5223 257/307 |
| 6,913,966 | B2 * | 7/2005 | Baker | H01L 23/5223 257/E27.048 |
| 6,963,122 | B1 * | 11/2005 | Soenen | H01L 23/5223 257/532 |
| 6,996,892 | B1 * | 2/2006 | Dening | H05K 1/165 336/200 |
| 7,054,599 | B2 * | 5/2006 | Ma | H04B 1/406 361/748 |
| 7,095,108 | B2 * | 8/2006 | Palanduz | H05K 1/0231 257/E23.067 |
| 7,135,366 | B2 * | 11/2006 | Rotella | H01L 28/86 257/E27.048 |
| 7,154,734 | B2 * | 12/2006 | Schultz | H01G 2/22 361/321.2 |
| 7,202,548 | B2 * | 4/2007 | Lee | H01L 23/5223 257/532 |
| 7,561,407 | B1 * | 7/2009 | Chen | H01G 4/228 361/321.1 |
| 7,768,044 | B2 * | 8/2010 | He | H01L 23/5223 257/296 |
| 7,838,964 | B2 * | 11/2010 | Carobolante | H01L 28/10 257/532 |
| 8,039,923 | B2 * | 10/2011 | Harris | H01L 28/40 257/532 |
| 8,115,276 | B2 * | 2/2012 | Zhang | H01L 27/0207 257/532 |
| 8,228,680 | B2 * | 7/2012 | Myat | H01L 23/50 361/764 |
| 8,502,293 | B2 * | 8/2013 | Lindert | H01L 23/5223 257/532 |
| 8,502,342 | B1 * | 8/2013 | Ben Artsi | H01L 23/5223 257/532 |
| 8,569,861 | B2 * | 10/2013 | O'Donnell | G01N 27/226 257/E23.149 |
| 8,617,990 | B2 * | 12/2013 | Mallik | H01L 23/49838 438/668 |
| 8,872,349 | B2 * | 10/2014 | Chiu | H01L 21/30604 257/E23.145 |
| 9,000,876 | B2 * | 4/2015 | Tsai | H01L 23/5225 336/84 R |
| 9,035,421 | B2 * | 5/2015 | Song | H01L 25/0657 257/531 |
| 9,113,573 | B2 * | 8/2015 | Liu | H01L 24/03 |
| 9,198,293 | B2 * | 11/2015 | Chase | H01L 23/49822 |
| 9,202,803 | B2 * | 12/2015 | Zhang | H05K 3/4694 |
| 9,420,693 | B2 * | 8/2016 | Sankman | H05K 1/185 |
| 9,443,843 | B2 * | 9/2016 | Lee | H01L 28/60 |
| 9,496,211 | B2 * | 11/2016 | Kulkarni | H01L 23/49822 |
| 9,558,945 | B2 * | 1/2017 | Fukuzumi | H01L 27/0688 |
| 9,876,031 | B1 * | 1/2018 | Shimizu | H10B 43/27 |
| 9,978,732 | B2 * | 5/2018 | Penunuri | H01L 23/66 |
| 10,037,938 | B2 * | 7/2018 | Kim | H01L 24/20 |
| 10,483,249 | B2 * | 11/2019 | Gardner | H01L 25/105 |
| 10,714,434 | B1 * | 7/2020 | Pietambaram | H01L 23/5389 |
| 10,867,934 | B2 * | 12/2020 | Maruthamuthu | H01L 21/4857 |
| 10,879,170 | B2 * | 12/2020 | Chiang | H01L 21/76816 |
| 10,896,780 | B2 * | 1/2021 | Maruthamuthu | H01L 23/5226 |
| 10,903,182 | B1 * | 1/2021 | Wang | H03F 3/211 |
| 10,923,417 | B2 * | 2/2021 | Liao | H01L 24/24 |
| 10,998,261 | B2 * | 5/2021 | Kong | H01L 23/315 |
| 11,251,113 | B2 * | 2/2022 | Vadlamani | H01L 23/49811 |
| 11,417,586 | B2 * | 8/2022 | Elsherbini | H01L 21/4871 |
| 11,538,633 | B2 * | 12/2022 | Goh | H01L 23/16 |
| 2005/0230835 | A1 * | 10/2005 | Sunohara | H05K 1/185 257/E23.178 |
| 2008/0128859 | A1 | 6/2008 | Chen | |
| 2011/0018095 | A1 | 1/2011 | Booth, Jr. | |
| 2012/0261787 | A1 | 10/2012 | Stamper | |
| 2013/0119557 | A1 | 5/2013 | Or Bach | |
| 2014/0001597 | A1 * | 1/2014 | Huang | H01L 21/7682 257/532 |
| 2016/0329299 | A1 * | 11/2016 | Lin | H01L 23/5385 |
| 2017/0077050 | A1 * | 3/2017 | Elsayed | H01F 17/0006 |
| 2018/0020547 | A1 * | 1/2018 | Chan | H05K 1/183 |
| 2018/0240860 | A1 | 8/2018 | Yang | |
| 2018/0332708 | A1 * | 11/2018 | Lambert | H05K 1/181 |
| 2020/0075491 | A1 * | 3/2020 | Dogiamis | H01L 23/49822 |
| 2020/0211949 | A1 * | 7/2020 | Strong | H01L 21/561 |
| 2021/0066277 | A1 | 3/2021 | Kim | |
| 2021/0098394 | A1 | 4/2021 | Guo | |
| 2021/0202377 | A1 * | 7/2021 | Elsherbini | H01L 25/0657 |
| 2021/0287984 | A1 * | 9/2021 | Li | H01L 28/86 |
| 2022/0084736 | A1 * | 3/2022 | Choi | H01L 23/49822 |
| 2022/0102055 | A1 * | 3/2022 | Marin | H01F 27/2804 |
| 2022/0254872 | A1 * | 8/2022 | Park | H01G 4/38 |
| 2022/0406512 | A1 * | 12/2022 | Ning | H01L 25/0657 |
| 2022/0406523 | A1 * | 12/2022 | Kamgaing | H01G 4/40 |
| 2022/0415555 | A1 * | 12/2022 | Dogiamis | H01L 25/0657 |
| 2022/0415572 | A1 * | 12/2022 | Park | H01G 4/002 |
| 2023/0197767 | A1 * | 6/2023 | Park | H01G 4/012 257/532 |
| 2023/0207465 | A1 * | 6/2023 | Wei | H01L 29/78696 |
| 2024/0234283 | A9 * | 7/2024 | Cheah | H01L 23/498 |

OTHER PUBLICATIONS

Office Action from Taiwanese Patent Application No. 111109908 mailed May 26, 2025, 9 pgs.

\* cited by examiner

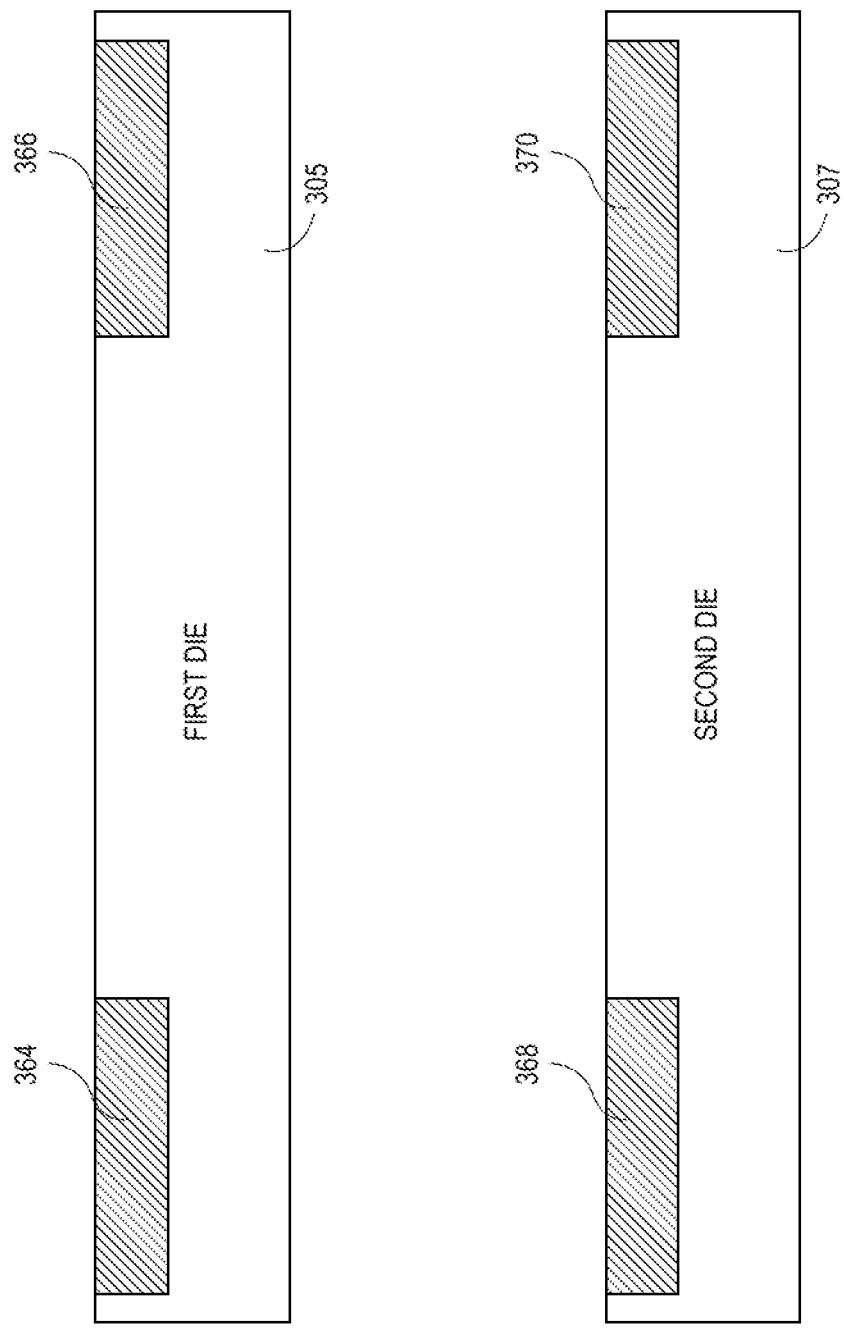

CAPACITOR FORMED WITH COUPLED DIES

FIELD

Embodiments of the present disclosure generally relate to the field of semiconductor packaging, and in particular creating capacitors within packages.

BACKGROUND

Continued growth in virtual machines and cloud computing will continue to increase the demand for increased component density within packages.

BRIEF DESCRIPTION OF THE DRAWINGS

FIGS. 3A-3I illustrate various stages of manufacturing of a capacitor formed by coupled dies, in accordance with various embodiments.

DETAILED DESCRIPTION

Figure 1:
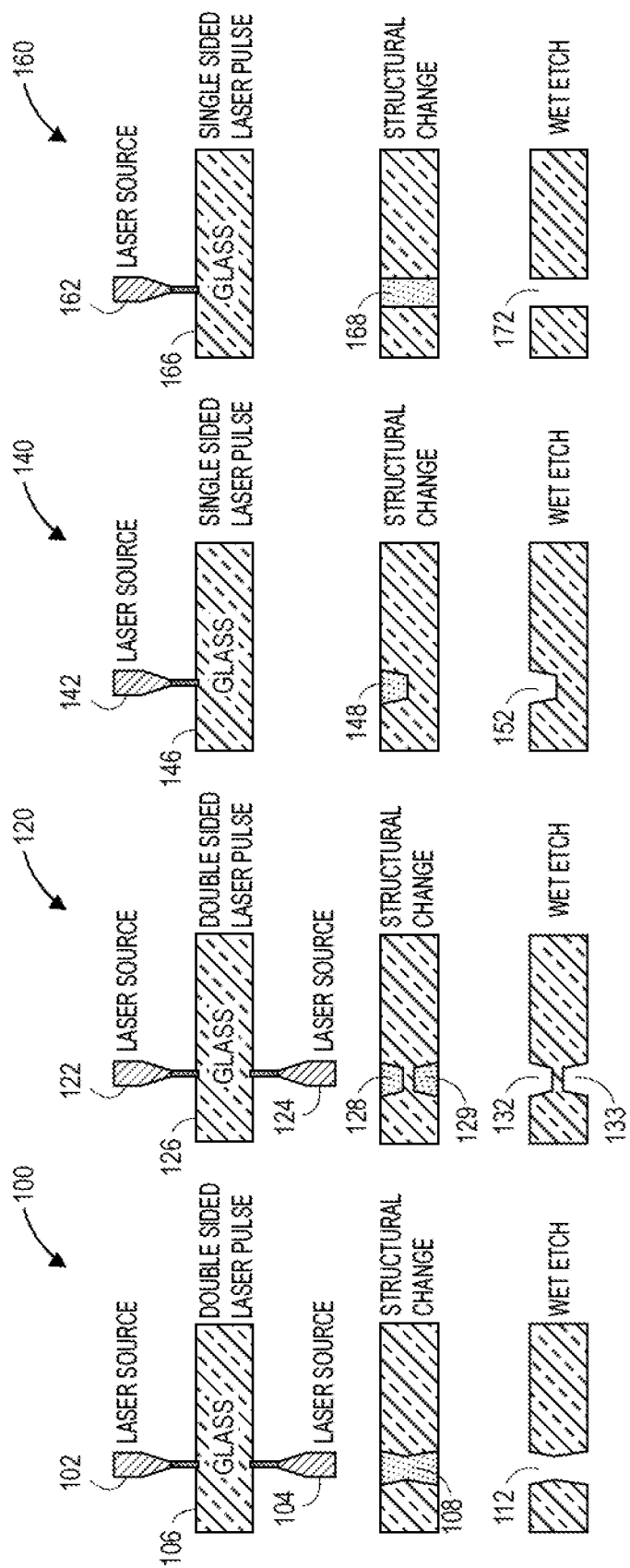
FIG. 1 illustrates multiple examples of laser-assisted etching of glass interconnects processes, in accordance with various embodiments.

Embodiments described herein may be related to apparatuses, processes, and techniques directed to creating capacitors that are formed by coupling dies. In embodiments, capacitors may be formed using lines in a bond pad layer within hybrid bonding techniques. In embodiments, these techniques may involve using dummy bond pads, where the width of these dummy bond pads are smaller than that of active bond pads, to create a pattern to serve as a capacitor structure, and then connect the capacitor to either a Vdd or Vss source.

In embodiments, such capacitors may be formed within structures that ordinarily would have no components. As a result, more of these capacitors may be made available within a package. In embodiments, these capacitors may be decoupling capacitors, with additional decoupling capacitors helping with ground bounce during operation of high-performance circuits, which in turn may enable higher performance of devices. During manufacturing, these capacitors may be formed without involving extra processing steps in addition to regular bond pad forming process.

In embodiments, the processes and/or techniques described herein may be performed using dies that may include silicon or glass wafers. Although the techniques described herein are focused on silicon, various glass etching techniques may be used for glass wafers as described with respect to FIG. 1.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 illustrates multiple examples of laser-assisted etching of glass interconnects processes, in accordance with embodiments. FIG. 1 illustrates multiple examples of laser-assisted etching of glass interconnects processes (which may be referred to as "LEGIT" herein), in accordance with embodiments. One use of the LEGIT technique is to provide an alternative substrate core material to the legacy copper clad laminate (CCL) core used in semiconductor packages used to implement products such as servers, graphics, clients, 5G, and the like. By using laser-assisted etching, crack free, high density via drills, hollow shapes may be formed into a glass substrate. In embodiments, different process parameters may be adjusted to achieve drills of various shapes and depths, thus opening the door for innovative devices, architectures, processes, and designs in glass. Embodiments, such as the bridge discussed herein, may also take advantage of these techniques.

Diagram 100 shows a high level process flow for a through via and blind via (or trench) in a microelectronic package substrate (e.g. glass) using LEGIT to create a through via or a blind via. A resulting volume/shape of glass with laser-induced morphology change that can then be selectively etched to create a trench, a through hole or a void that can be filled with conductive material. A through via 112 is created by laser pulses from two laser sources 102, 104 on opposite sides of a glass wafer 106. As used herein, a through drill and a through via refers to when the drill or the via starts on one side of the glass/substrate and ends on the other side. A blind drill and a blind via refers to when the drill or the via starts on the surface of the substrate and stops half way inside the substrate. In embodiments, the laser pulses from the two laser sources 102, 104 are applied perpendicularly to the glass wafer 106 to induce a morphological change 108, which may also be referred to as a structural change, in the glass that encounters the laser pulses. This morphological change 108 includes changes in the molecular structure of the glass to make it easier to etch out (remove a portion of the glass). In embodiments, a wet etch process may be used.

Diagram 120 shows a high level process flow for a double blind shape. A double blind shape 132, 133 may be created by laser pulses from two laser sources 122, 124, which may be similar to laser sources 102, 104, that are on opposite sides of the glass wafer 126, which may be similar to glass wafer 106. In this example, adjustments may be made in the laser pulse energy and/or the laser pulse exposure time from the two laser sources 122, 124. As a result, morphological changes 128, 129 in the glass 126 may result, with these changes making it easier to etch out portions of the glass. In embodiments, a wet etch process may be used.

Diagram 140 shows a high level process flow for a single-blind shape, which may also be referred to as a trench. In this example, a single laser source 142 delivers a laser pulse to the glass wafer 146 to create a morphological change 148 in the glass 146. As described above, these morphological changes make it easier to etch out a portion of the glass 152. In embodiments, a wet etch process may be used.

Diagram 160 shows a high level process flow for a through via shape. In this example, a single laser source 162 applies a laser pulse to the glass 166 to create a morphological change 168 in the glass 166, with the change making it easier to etch out a portion of the glass 172. As shown here, the laser pulse energy and/or laser pulse exposure time from the laser source 162 has been adjusted to create an etched out portion 172 that extends entirely through the glass 166.

With respect to FIG. 1, although embodiments show laser sources 102, 104, 122, 124, 142, 162 as perpendicular to a surface of the glass 106, 126, 146, 166, in embodiments, the laser sources may be positioned at an angle to the surface of the glass, with pulse energy and/or pulse exposure time variations in order to cause a diagonal via or a trench, or to shape the via, such as 112, 172, for example to make it cylindrical, tapered, or include some other feature. In addition, varying the glass type may also cause different features within a via or a trench as the etching of glass is strongly dependent on the chemical composition of the glass.

In embodiments using the process described with respect to FIG. 1, through hole vias 112, 172 may be created that are less than 10 μm in diameter, and may have an aspect ratio of 40:1 to 50:1. As a result, a far higher density of vias may be placed within the glass and be placed closer to each other at a fine pitch. In embodiments, this pitch may be 50 μm or less. After creating the vias or trenches, a metallization process may be applied in order to create a conductive pathway through the vias or trenches, for example a plated through hole (PTH). Using these techniques, finer pitch vias will result in better signaling, allowing more I/O signals to be put through the glass wafer and to other coupled components such as a substrate.

Figure 2A:
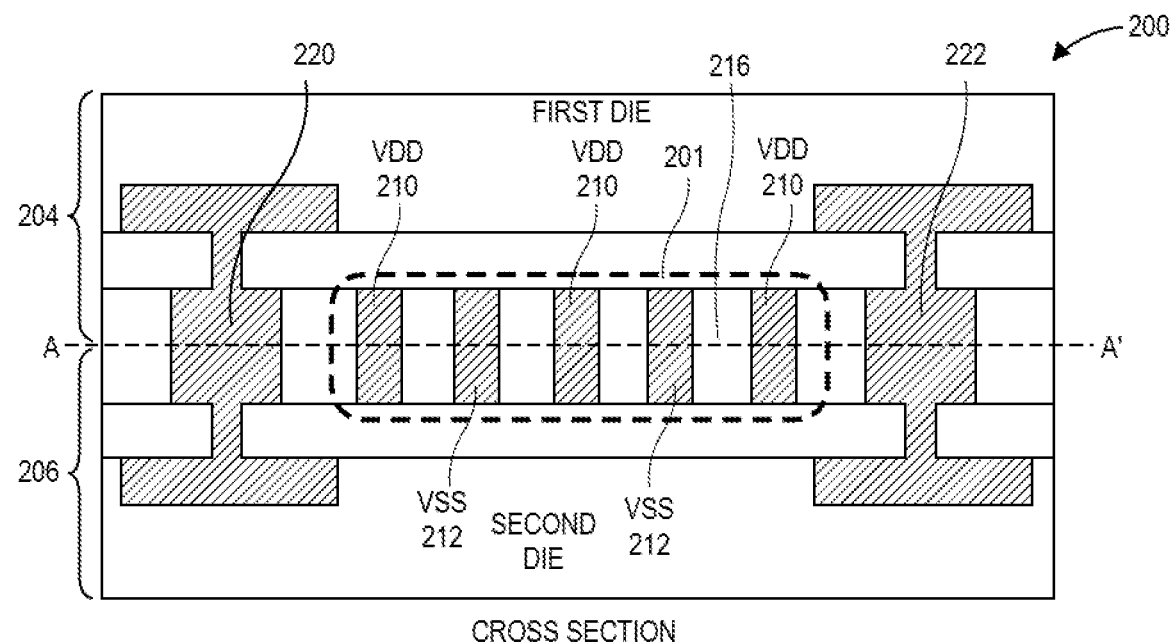
FIGS. 2A-2B illustrate a side view and a top-down view of a capacitor formed with coupled dies, in accordance with various embodiments.
Figure 2B:
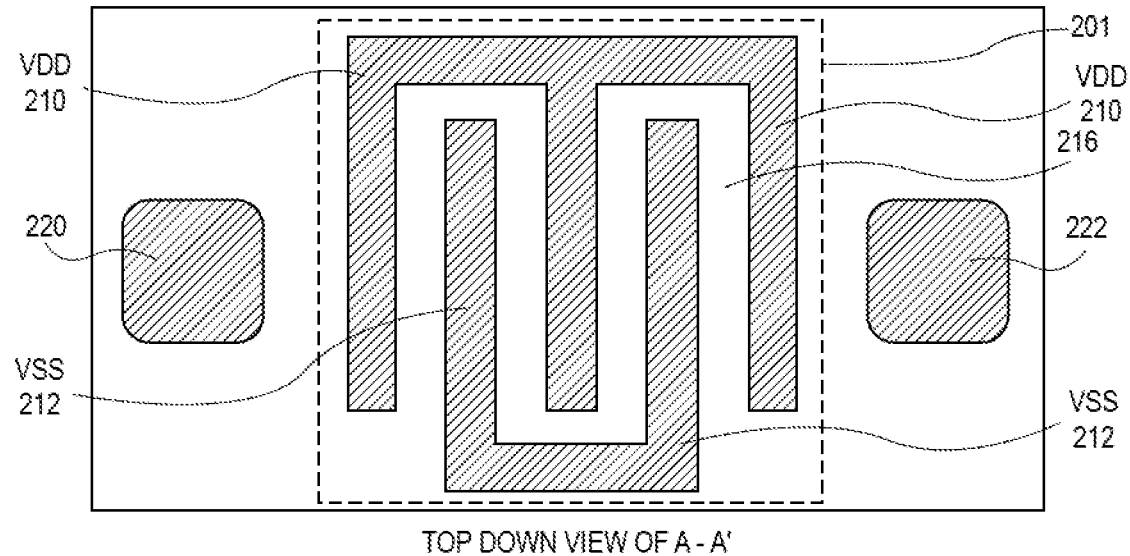

FIGS. 2A-2B illustrate a side view and a top-down view of a capacitor formed with coupled dies, in accordance with various embodiments. FIG. 2A shows a side view and FIG. 2B shows a top-down view at cut A-A' of FIG. 2A of a system-on-a-chip (SOC) 200 that is formed when a first die 204 is coupled with a second die 206. When the first die 204 and the second die 206 are coupled, the region 201 forms a capacitor. As shown and as discussed further below, various copper patterns have been created in the first die 204 and the second die 206, such that when they are joined they form a capacitor within the region 201.

It should be appreciated that although FIG. 2A shows only layers at or near the top of the first die 204 and the second die 206, for example a bond pad layer and a bond pad-1 layer, the first die 204 and/or the second die 206 may include other structures. These other structures may include active and/or passive components within the respective dies, for example transistors, interconnects, or other components.

In example embodiments, the first die 204 may be a central processing unit (CPU) and the second die 206 may be a memory die. In these embodiments, the capacitor within region 201 may serve as a decoupling capacitor for both the CPU within the first die 204 and the memory structures within the second die 206. In embodiments, the first die 204 and/or the second die 206 may include through silicon vias (TSV) that may be used to route power or signals from a front side of the die to a backside of the die. In embodiments, these TSVs (not shown) may be electrically and physically coupled with bonding balls that may be used to connect the SOC 200 formed by the first die 204 and the second die 206 to a substrate.

It should also be appreciated that the techniques described herein may be used to create a capacitor or other structure between two wafers, that may be similar to the first die 204 and the second die 206, to create a capacitor structure when the two wafers are coupled. In embodiments, these wafers may be silicon wafers or glass wafers.

In this embodiment, the capacitor within region 201 includes two separate traces, a Vdd trace 210, and a Vss trace 212. As shown, these traces are electrically isolated from each other, and may be separated by a nonconductive or a dielectric material 216 that separates the Vdd trace 210, and the Vss trace 212. In embodiments, the trace pattern within region 201 is duplicated in both the top first die 204 and the bottom second die 206. When coupled, the trace patterns in the first die 204 and the second die 206 merged to form the capacitor structure that is within region 201.

In embodiments, a first pad 220 and a second pad 222 may be formed on either side of the region 201 that includes the capacitor structure. In embodiments, the first pad 220 and the second pad 222 may conduct either signals or provide power. In embodiments, either the first pad 220 or the second pad 222 may be coupled with the Vdd trace 210 or the Vss trace 212.

Figure 3A:
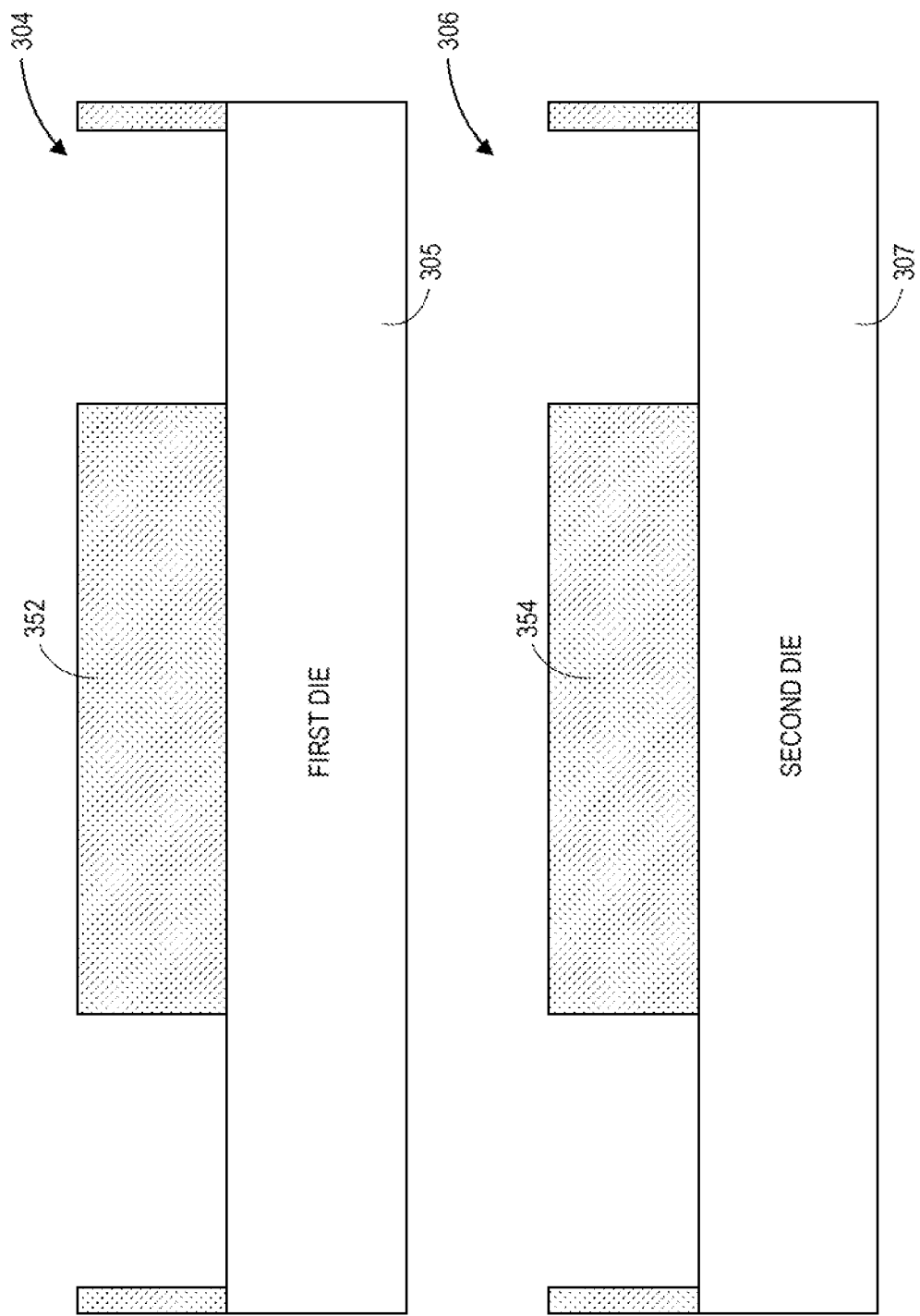

FIGS. 3A-3I illustrate various stages of manufacturing of a capacitor formed by coupled dies, in accordance with various embodiments. FIG. 3A shows a manufacturing stage of a first die 304 and of a second die 306, which may be similar to first to die 204 and second die 206 of FIG. 2A. A photoresist layer 352, which may be used in a lithography process to define an underlying bond pad layer, which may also be referred to as a bond pad-1 layer, is deposited on the first die substrate 305. Similarly, a photoresist layer 354 is deposited on the second die substrate 307, which is similarly used to define an underlying bond pad layer, which may also be referred to as a bond pad-1 layer. It should be appreciated that the first die substrate 305 and/or the second die substrate 307 may include active and/or passive elements as discussed above that are not shown in FIG. 3A. As shown, the photoresist layers 352, 354 are patterned for future etching. In embodiments, the first die substrate 305 and the second die substrate 307 may include silicon.

Note that in other manufacturing step embodiments, the first die substrate 305 and the second die substrate 307 may be glass substrates. In these embodiments, various processes related to FIG. 1 above for etching trenches are creating through vias within glass substrates is discussed at length.

Figure 3B:
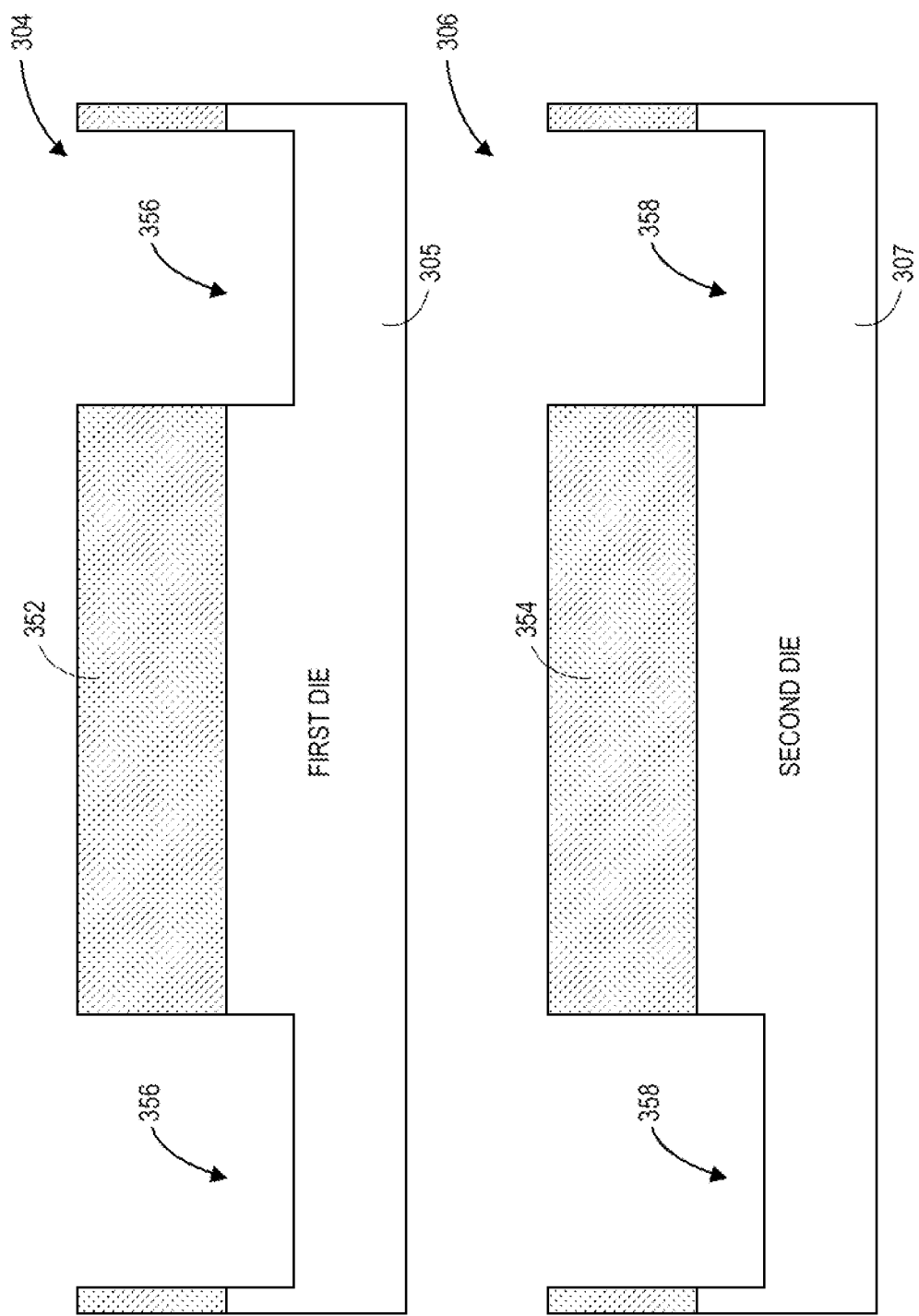

FIG. 3B shows a manufacturing stage of a first die 304 and a second die 306, wherein etch 356 has been made in the first die substrate 305, and a reactive ion etch 358 has been made in the second die substrate 307.

Figure 3C:
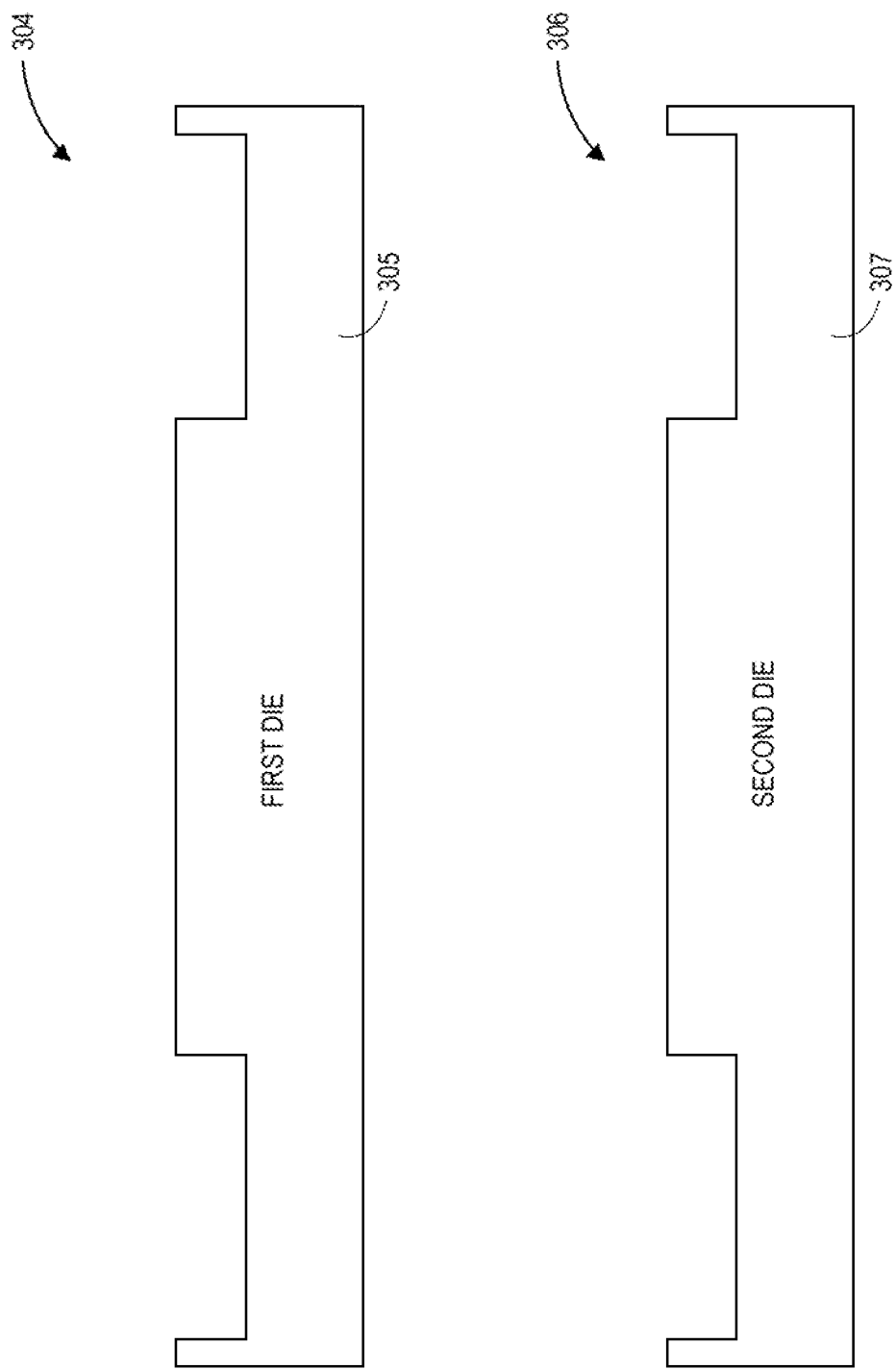

FIG. 3C shows a manufacturing stage where the photo resist 352 of the first die 304, and bond pad-1 layer 354 of the second die 306 has been removed.

Figure 3D:
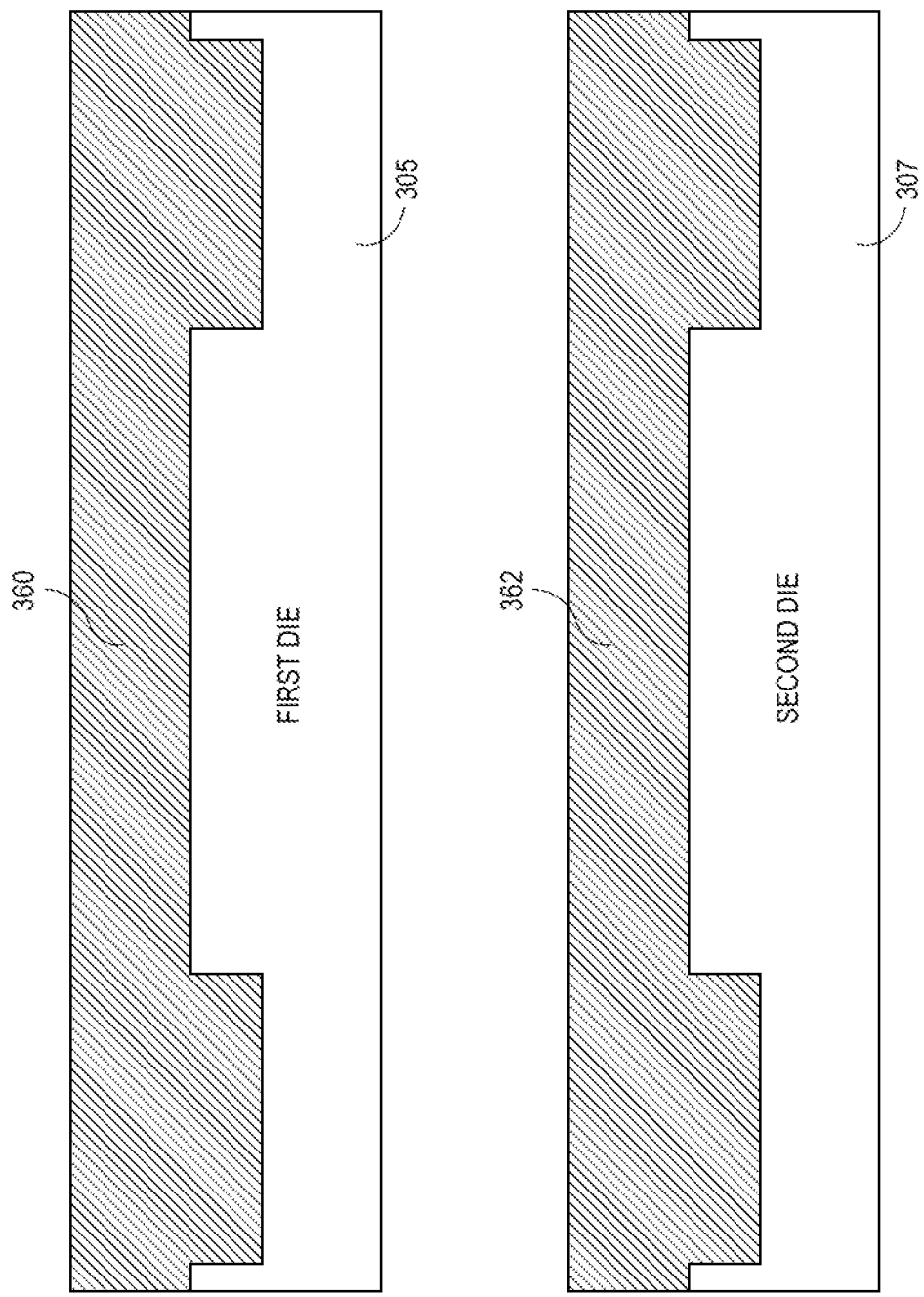

FIG. 3D shows a manufacturing stage where a metal deposition layer 360 is placed on the first die substrate 305, and a metal deposition layer 362 is placed on second die substrate 307.

FIG. 3E shows a manufacturing stage where the metal deposition layer 360 and the metal deposition layer 362 is polished. In embodiments, a chemical metal polish (CMP) may be used as a polishing technique. As a result of the polishing, metal lines 364, 366 will be recessed within first die substrate 305, and metal lines 368, 370 will be recessed within the second die substrate 307.

Figure 3F:
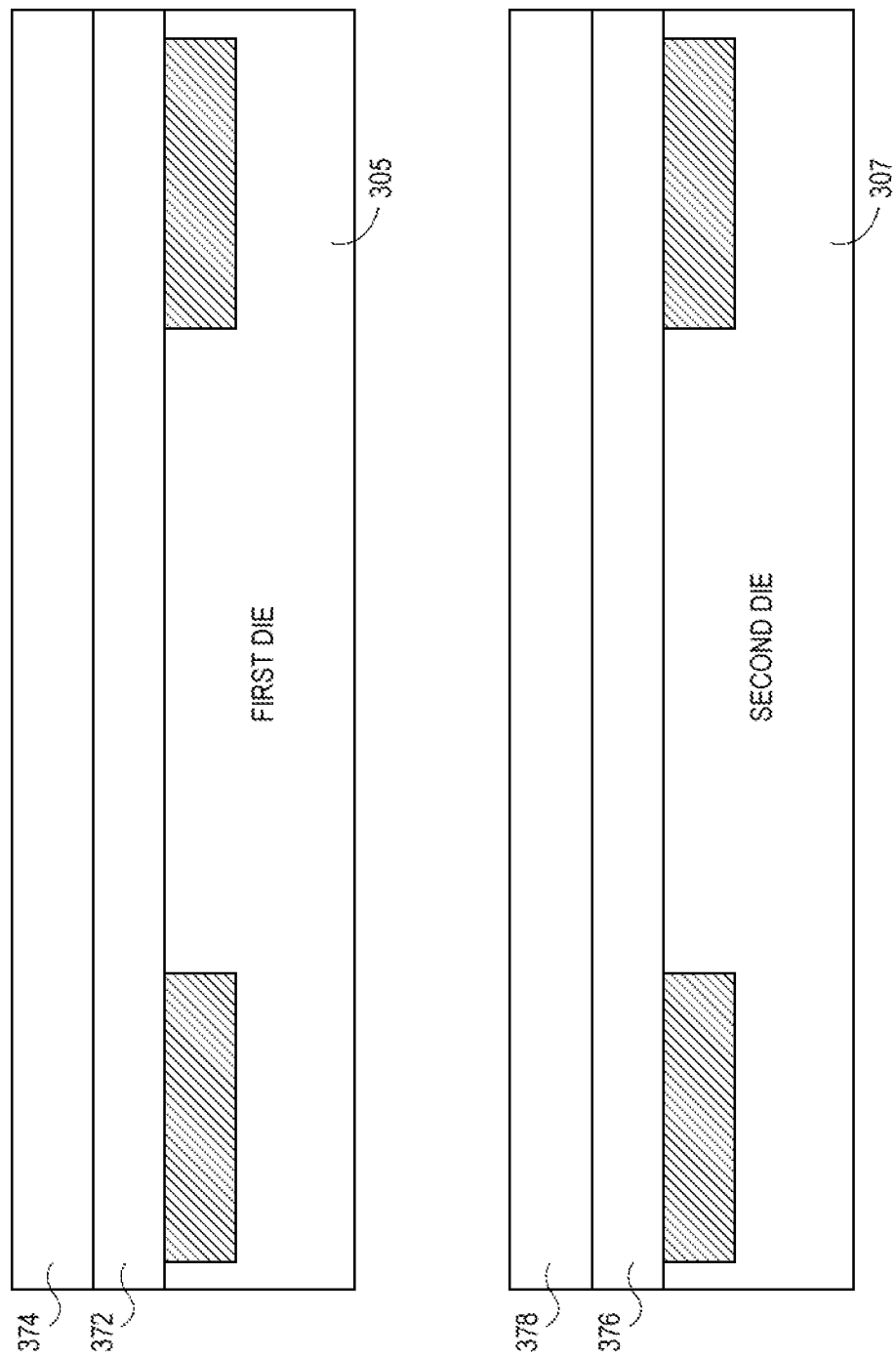

FIG. 3F shows a manufacturing stage that includes the deposition of an interlayer dielectric (ILD) material in layers 372, 374 on top of the first die substrate 305, and the deposition of ILD material in layers 376, 378 on top of the second die substrate 307.

Figure 3G:
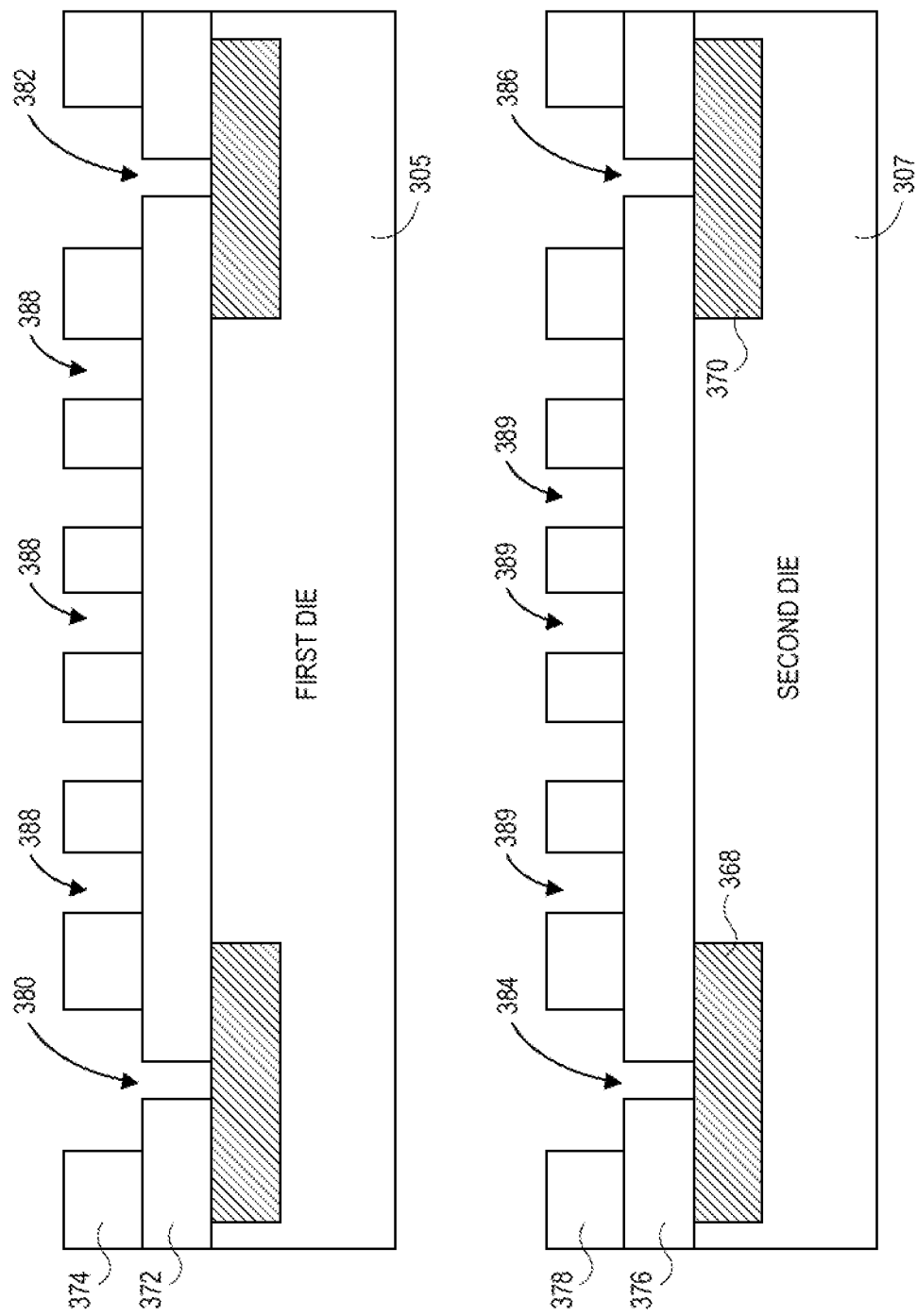

FIG. 3G shows a manufacturing stage with various vias into the ILD layers. In particular, vias 380, 382 may be cut into ILD layers 372, 374 to allow for electrical coupling, respectively, with metal lines 364, 366 (appeared in FIG. 3E not in 3G) recessed into first die substrate 305. In addition, vias 384, 386 may be cut into ILD layers 376, 378 to allow for electrical coupling, respectively, with metal lines 368, 370 recessed into second die substrate 307. Vias 388 may be cut into ILD layer 374 of the first die substrate 305, and vias 389 may be cut into ILD layer 378 of the second die substrate 307.

In embodiments, the vias 380, 382, 388 will be subsequently used to form a bond pad layer at the ILD layer 374 on the first die substrate 305. The vias 384, 386, 389 will be subsequently used to form a bond pad layer at the ILD layer 378 on the second die substrate 307.

Figure 3H:
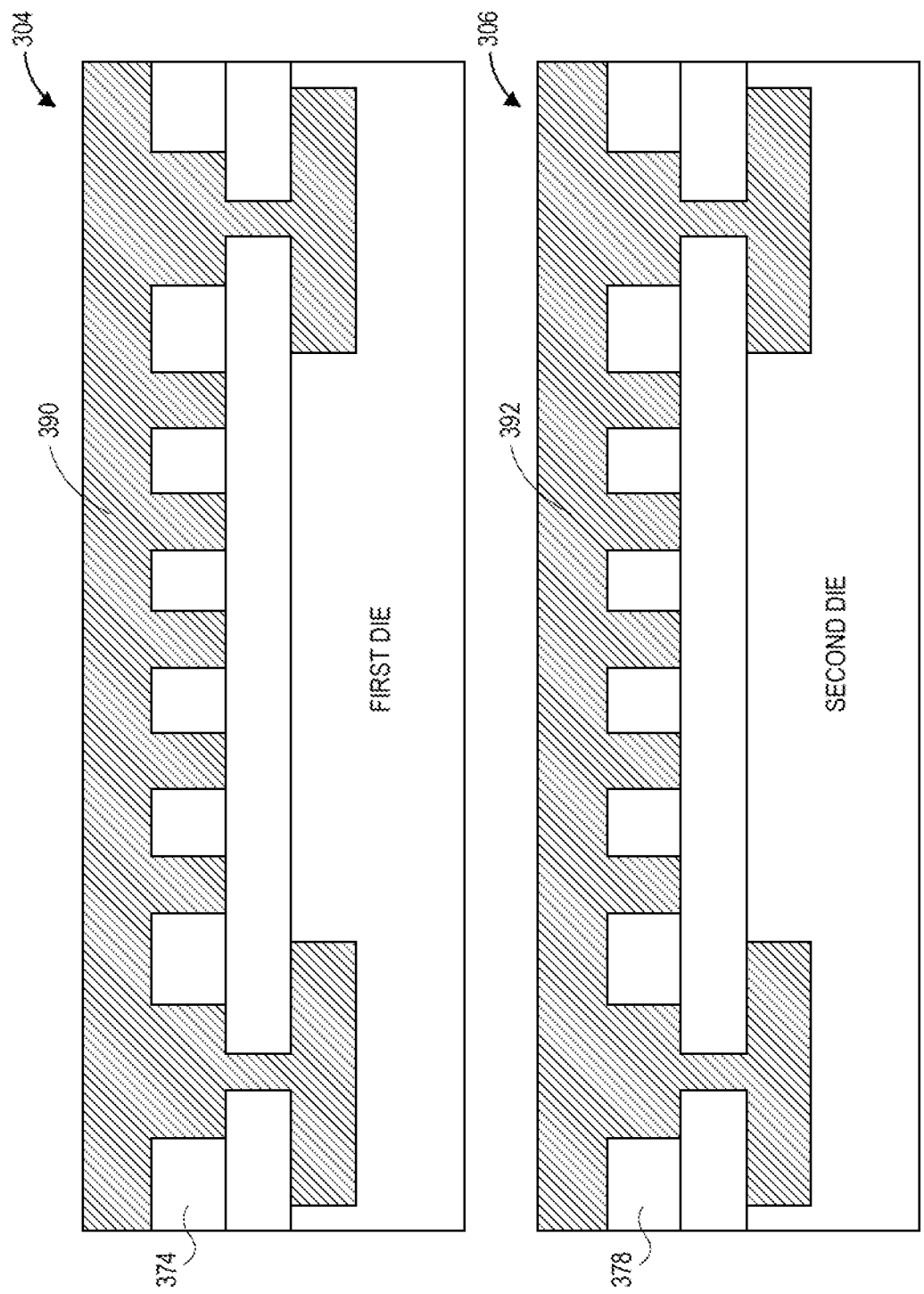
Figure 31:
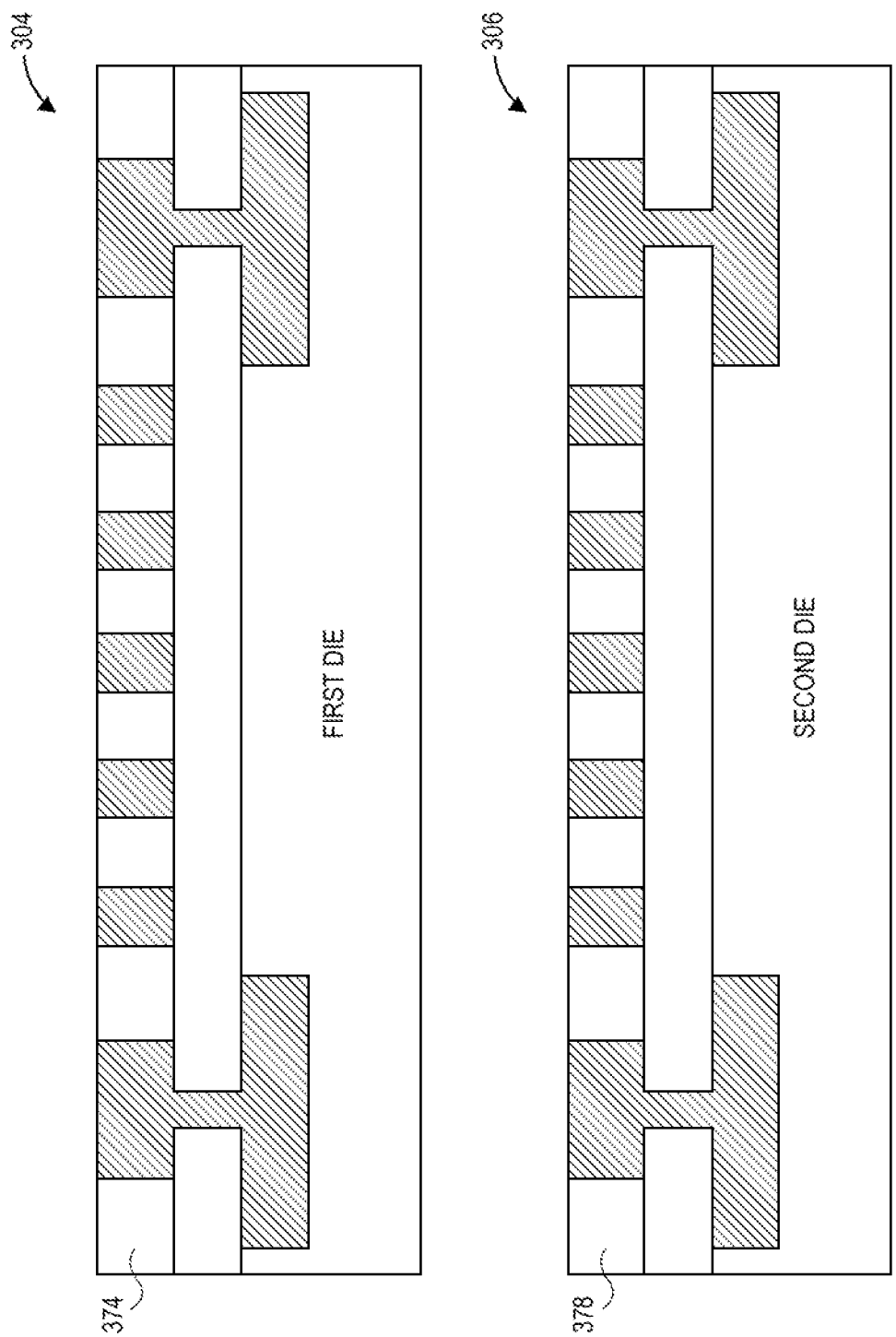

FIG. 3H shows a manufacturing stage with a metal deposition layer 390 applied to the first die 304 and a metal deposition layer 392 applied to the second die 306. In embodiments, the metal deposition layer may include copper or aluminum.

FIG. 3I shows a manufacturing stage prior to coupling the first die 304 with the second die 306. A chemical metal polish technology is used to polish the metal deposition layers 390, 392 (390 and 292 are in FIG. 3H) down to, respectively, the ILD layers 374, 378. Subsequent to this manufacturing stage, the top of the first die 304 may be coupled with the top of the second die 306 using thermocompression bonding like technology to produce the capacitor structure shown with respect to FIGS. 2A-2B.

Figure 4:
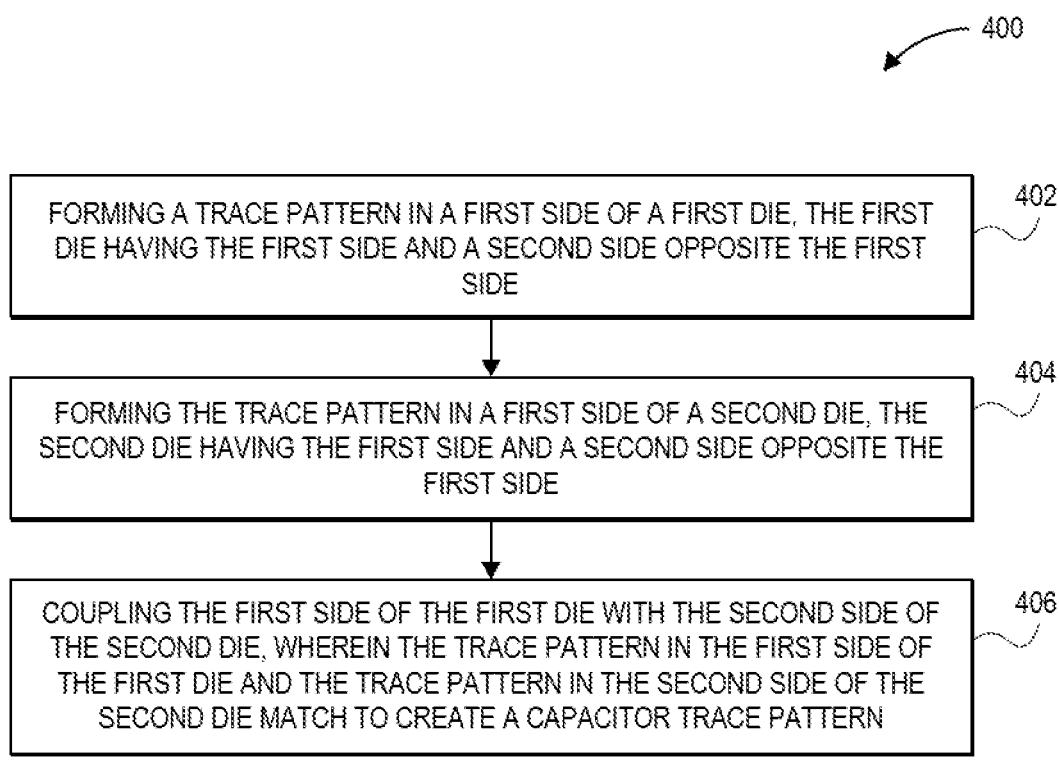
FIG. 4 illustrates an example process for manufacturing a capacitor formed with coupled dies, in accordance with various embodiments.

FIG. 4 illustrates an example process for manufacturing a capacitor formed with coupled dies, in accordance with various embodiments. Process 400 may be implemented using various techniques, apparatus, systems, and/or processes as described herein, and in particular with respect to FIGS. 1-3I.

At block 402, the process may include forming a trace pattern in a first side of a first die, the first die having the first side and a second side opposite the first side.

At block 404, the process may further include forming the trace pattern in a first side of a second die, the second die having the first side and a second side opposite the first side.

At block 406, the process may further include coupling the first side of the first die with the second side of the second die, wherein the trace pattern in the first side of the first die and the trace pattern in the second side of the second die match and create a capacitor trace pattern.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
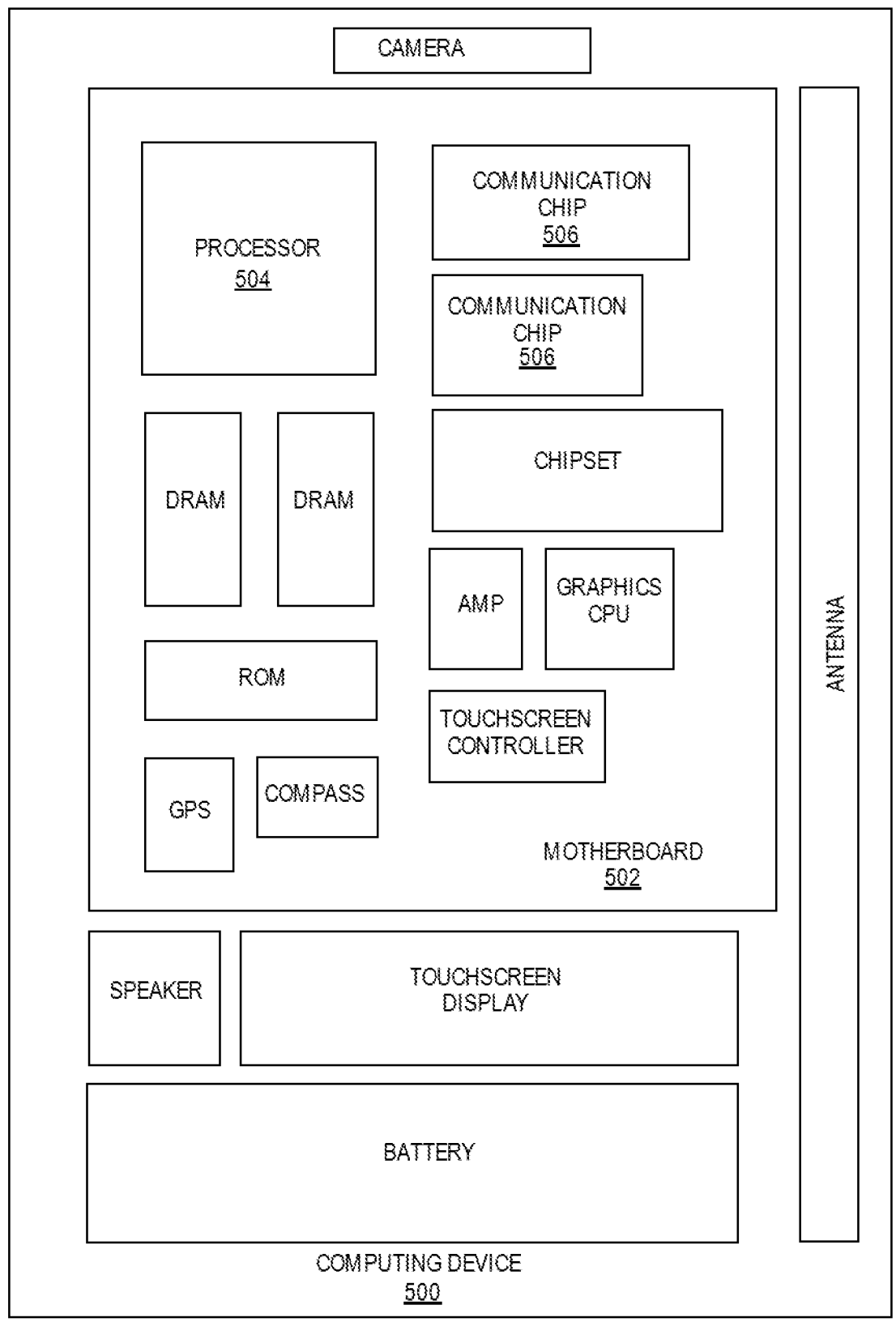
FIG. 5 illustrates a computing device 500 in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
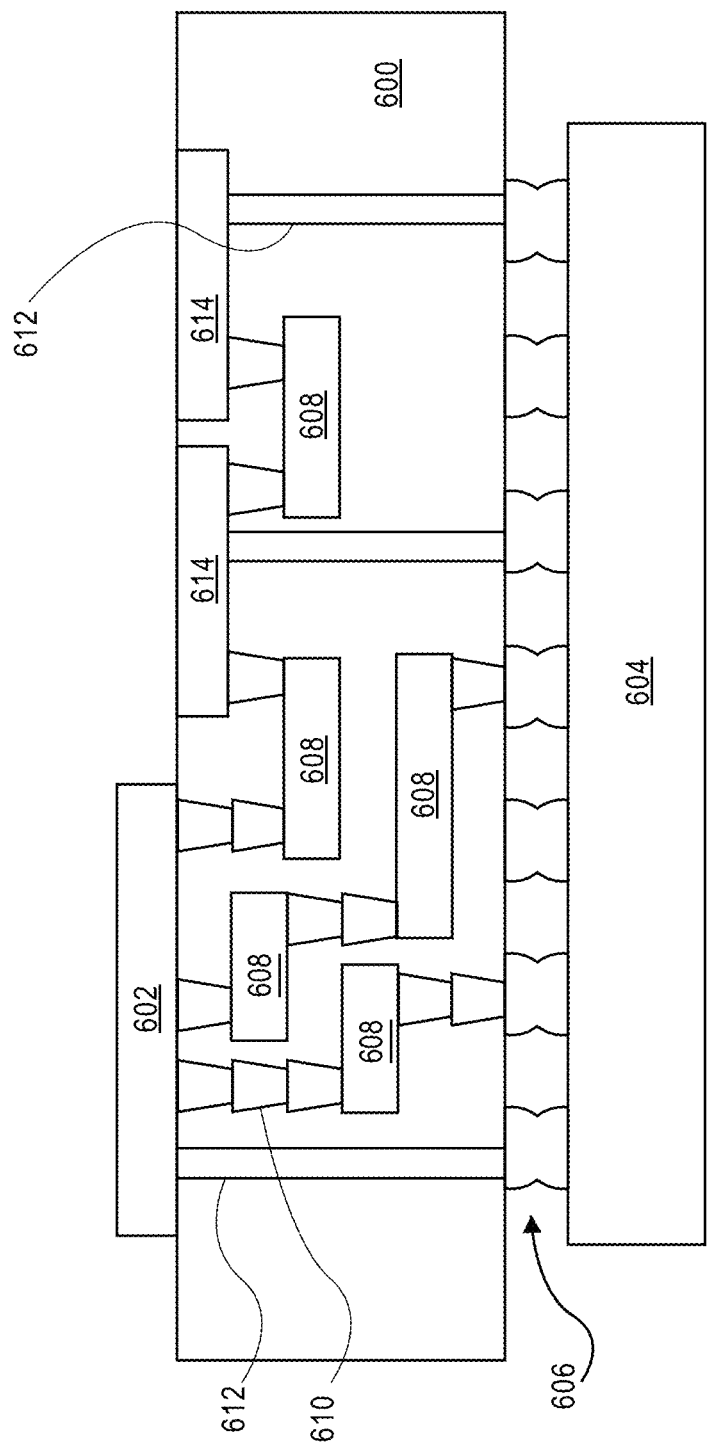
FIG. 6 illustrates an interposer 600 that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, and other group III-V and group IV materials.

The interposer 600 may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a capacitor comprising: a first die with a first side and a second side opposite the first side, the first side of the first die includes a trace pattern; a second die with a first side and a second side opposite the first side, the first side of the second die includes the trace pattern; and wherein the first side of the first die and the first side of the second die are coupled to form the trace pattern of the capacitor.

Example 2 includes the capacitor of example 1, wherein the trace pattern on the first side of the first die is at a first depth; wherein the trace pattern on the first side of the second die is at a second depth; and wherein the trace pattern of the capacitor is at a third depth which is a combination of the first depth and the second depth.

Example 3 includes the capacitor of example 2, wherein the first depth is equal to the second depth.

Example 4 includes the capacitor of example 2, wherein the first depth or the second depth ranges between 0.5 μm and 3 μm.

Example 5 includes the capacitor of example 1, wherein the trace pattern includes a first trace and a second trace, wherein the first trace and the second trace are not electrically coupled.

Example 6 includes the capacitor of example 5, wherein the first trace is electrically coupled with a Vdd or the second trace is electrically coupled with a Vss.

Example 7 includes the capacitor of any one of examples 1-6, further comprising a first pad at a first side of the trace pattern and a second pad at a second side of the trace pattern opposite the first side of the trace pattern.

Example 8 includes the capacitor of example 7, wherein the first pad extends into the first die and into the second die, or wherein the second pad extends into the first die and into the second die.

Example 9 includes the capacitor of example 7, wherein the first pad or the second pad are as a selected one of a Vdd source or a Vss source.

Example 10 includes the capacitor of any one of examples 1-6, wherein the trace pattern includes a selected one of: copper or aluminum.

Example 11 includes the capacitor of any one of examples 1-6, wherein the first die or the second die include a selected one of: a silicon layer or a glass layer.

Example 12 includes the capacitor of any one of examples 1-6, wherein the trace pattern is developed using dummy bond pads.

Example 13 is a system comprising: a component; an electrical device electrically coupled with the component, the electrical device comprising: a first die with a first side and a second side opposite the first side, the first side of the first die includes a trace pattern; a second die with a first side and a second side opposite the first side, the first side of the second die includes the trace pattern; and wherein the first side of the first die and the first side of the second die are coupled to form the trace pattern of the electrical device.

Example 14 includes the system of example 13, wherein the trace pattern on the first side of the first die is at a first depth; wherein the trace pattern on the first side of the second die is at a second depth; and wherein the trace pattern of the capacitor is at a third depth which is a combination of the first depth and the second depth.

Example 15 includes the system of example 14, wherein the first depth is equal to the second depth; or wherein the first depth or the second depth ranges between 1 µm and 3 µm.

Example 16 includes the system of any one of examples 13-15, wherein the electrical device is a selected one of a capacitor or an inductor.

Example 17 is a method comprising: forming a trace pattern in a first side of a first die, the first die having the first side and a second side opposite the first side; forming the trace pattern in a first side of a second die, the second die having the first side and a second side opposite the first side; and coupling the first side of the first die with the second side of the second die, wherein the trace pattern in the first side of the first die and the trace pattern in the second side of the second die match and create a capacitor trace pattern.

Example 18 includes the method of example 17, wherein forming a trace pattern further includes: forming a first trace and a second trace, wherein the first trace and the second trace are not electrically coupled.

Example 19 includes the method of example 18, further comprising: electrically coupling the first trace with a Vss source or a Vdd source.

Example 20 includes the method of any one of examples 17-19, wherein the trace pattern includes a selected one of: copper or aluminum.

What is claimed is:

1. A capacitor comprising:
    a first die with a first side and a second side opposite the first side, wherein the first side of the first die includes a trace pattern;
    a second die with a first side and a second side opposite the first side, wherein the first side of the second die includes the trace pattern; and
    wherein the first side of the first die and the first side of the second die are coupled to form a trace pattern of the capacitor, wherein the trace pattern of the capacitor comprises an interdigitated pattern, a first pad, and a second pad at an interface of the first side of the first die and the first side of the second die, the first pad at a first side of the interdigitated pattern, and the second pad at a second side of the interdigitated pattern, the second side laterally opposite the first side.

2. The capacitor of claim 1, wherein the trace pattern on the first side of the first die is at a first depth; wherein the trace pattern on the first side of the second die is at a second depth; and wherein the trace pattern of the capacitor is at a third depth which is a combination of the first depth and the second depth.

3. The capacitor of claim 2, wherein the first depth is equal to the second depth.

4. The capacitor of claim 2, wherein the first depth or the second depth ranges between 0.5 µm and 3 µm.

5. The capacitor of claim 1, wherein the trace pattern includes a first trace and a second trace, wherein the first trace and the second trace are not electrically coupled.

6. The capacitor of claim 5, wherein the first trace is electrically coupled with a Vdd or the second trace is electrically coupled with a Vss.

7. The capacitor of claim 1, wherein the first pad extends into the first die and into the second die, or wherein the second pad extends into the first die and into the second die.

8. The capacitor of claim 1, wherein the first pad or the second pad are as a selected one of a Vdd source or a Vss source.

9. The capacitor of claim 1, wherein the trace pattern includes a selected one of: copper or aluminum.

10. The capacitor of claim 1, wherein the first die or the second die include a selected one of: a silicon layer or a glass layer.

11. The capacitor of claim 1, wherein the trace pattern is developed using dummy bond pads.

12. A system comprising:
    a component;
    an electrical device electrically coupled with the component, the electrical device comprising:
        a first die with a first side and a second side opposite the first side, wherein the first side of the first die includes a trace pattern;
        a second die with a first side and a second side opposite the first side, wherein the first side of the second die includes the trace pattern; and
        wherein the first side of the first die and the first side of the second die are coupled to form a trace pattern of the electrical device, wherein the trace pattern of the capacitor comprises an interdigitated pattern, a first pad, and a second pad at an interface of the first side of the first die and the first side of the second die, the first pad at a first side of the interdigitated pattern, and the second pad at a second side of the interdigitated pattern, the second side laterally opposite the first side.

13. The system of claim 12, wherein the trace pattern on the first side of the first die is at a first depth; wherein the trace pattern on the first side of the second die is at a second depth; and wherein the trace pattern of the electrical device is at a third depth which is a combination of the first depth and the second depth.

14. The system of claim 13, wherein the first depth is equal to the second depth; or wherein the first depth or the second depth ranges between 1 µm and 3 µm.

15. The system of claim 12, wherein the electrical device is a selected one of a capacitor or an inductor.

16. A method comprising:
    forming a trace pattern in a first side of a first die, the first die having the first side and a second side opposite the first side;
    forming the trace pattern in a first side of a second die, the second die having the first side and a second side opposite the first side; and
    coupling the first side of the first die with the second side of the second die, wherein the trace pattern in the first side of the first die and the trace pattern in the second side of the second die match and create a capacitor trace pattern, wherein the capacitor trace pattern comprises an interdigitated pattern, a first pad, and a second pad at an interface of the first side of the first die and the second side of the second die, the first pad at a first side of the interdigitated pattern, and the second pad at a second side of the interdigitated pattern, the second side laterally opposite the first side.

17. The method of claim 16, wherein forming a trace pattern further includes: forming a first trace and a second trace, wherein the first trace and the second trace are not electrically coupled.

18. The method of claim 17, further comprising: electrically coupling the first trace with a Vss source or a Vdd source.

19. The method of claim 16, wherein the trace pattern includes a selected one of: copper or aluminum.

\* \* \* \* \*